United States Patent [19]
Kersten

[11] 4,098,633
[45] Jul. 4, 1978

[54] METHOD OF MAKING RADIATION SEAL
[75] Inventor: Gerard M. Kersten, Ridgecrest, Calif.
[73] Assignee: The United States of America as represented by the Secretary of the Navy, Washington, D.C.
[21] Appl. No.: 762,084
[22] Filed: Jan. 24, 1977
[51] Int. Cl.² .............................................. B29H 3/00
[52] U.S. Cl. .................................. 156/245; 156/294; 156/304; 174/35 R; 174/35 GC
[58] Field of Search ............... 156/242, 245, 294, 157, 156/158, 304; 264/45.1, 46.4, 46.7, 46.9; 174/35 R, 35 GC

[56] References Cited
U.S. PATENT DOCUMENTS

| 2,477,267 | 7/1949 | Robinson | 174/35 GC |
| 2,866,999 | 1/1959 | Taylor | 264/322 |
| 2,982,999 | 5/1961 | Stewart | 29/527.1 |
| 3,019,281 | 1/1962 | Hartwell | 174/35 GC |
| 3,312,769 | 4/1967 | Kaff | 174/35 GC |
| 3,413,406 | 11/1968 | Plummer | 174/35 GC |
| 3,472,926 | 10/1969 | Micia et al. | 264/292 |
| 3,520,750 | 7/1970 | Li et al. | 156/199 |
| 3,660,192 | 5/1972 | Smith et al. | 156/304 |
| 3,774,277 | 11/1973 | Bentley-Leek | 29/157.1 R |
| 3,801,406 | 4/1974 | Debevedetti | 156/306 |

Primary Examiner—Caleb Weston
Attorney, Agent, or Firm—R. S. Sciascia; Roy Miller; W. Thom Skeer

[57] ABSTRACT

A method and apparatus for producing an accurately sized elastomeric seal with a flexible outer electromagnetic radiation (EMR) shield.

3 Claims, 3 Drawing Figures

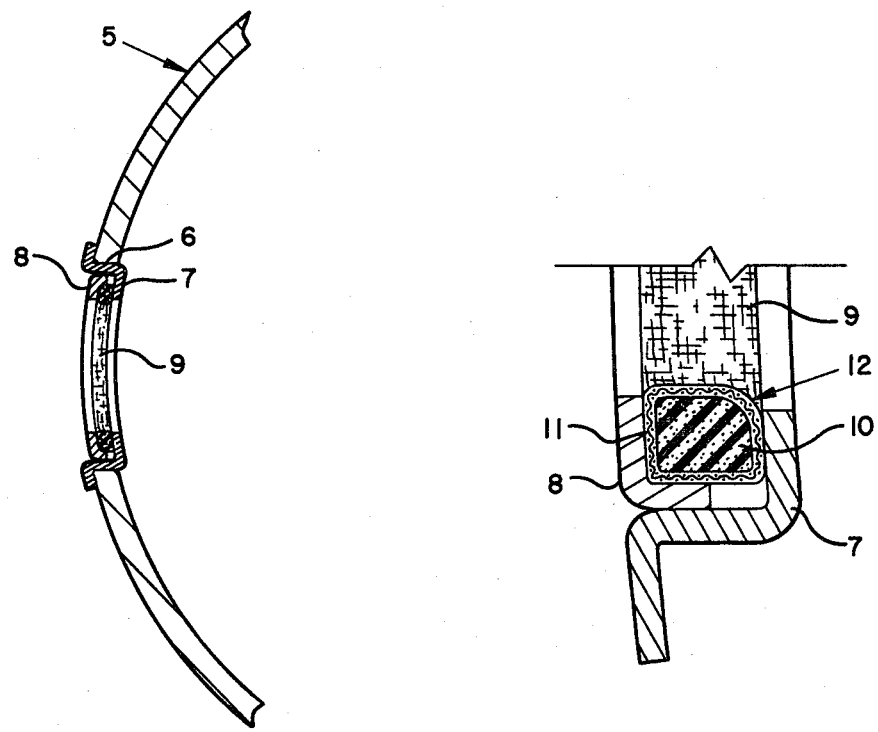
Fig. 1
Fig. 2
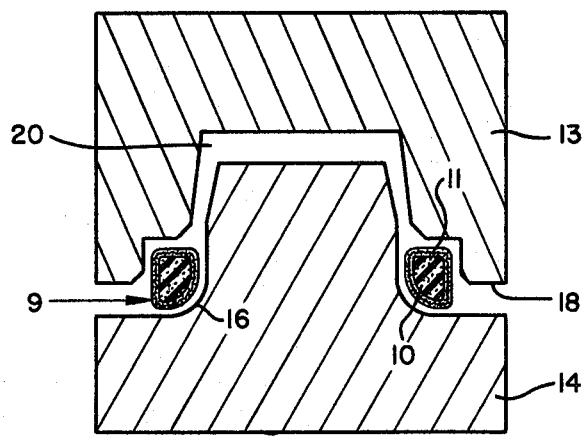
Fig. 3

METHOD OF MAKING RADIATION SEAL

BACKGROUND OF THE INVENTION

In certain military missiles, for example, external air foils are connected to internal controls. This arrangement necessarily involves a penetration of the missile skin by one or more control shafts or rocker arms and, the penetration of the missile skin destroys the integrity of the electromagnetic radiation shield. In order to block any stray electromagnetic radiation which might enter the missile through the opening and interfere with proper missile operation, a shielded annular seal has been devised to close the space around the control shafts.

The seals currently being used for this purpose are made of sponge rubber covered with a woven wire mesh, the ends of which must be woven together by hand. No means of mass producing these parts has yet been devised and the hand made parts are subject to a wide variation of dimensions. Because such hand made parts have been found to be unacceptable for their purpose, other methods have been sought which would produce an acceptable product.

SUMMARY OF THE INVENTION

According to the present invention, the old hand-crafting method has been supplemented by a forming step whereby the seals are confined in a proper configuration while heat is applied sufficient to vulcanize the sponge rubber and stabilize the seal form. The apparatus for carrying out this portion of the method is a simple die of male and female sections which confine the undimensioned seals in a manner to place the product in a condition which will conform to rigid specifications.

BRIEF DESCRIPTION OF THE DRAWING

FIG. 1 is a fragmentary cross sectional view of a housing fitted with a seal in accordance with the present invention;

FIG. 2 is an enlarged detail view of a portion of FIG. 1;

FIG. 3 is a cross-sectional view taken through an axis of symmetry of a mold arrangement according to the present invention, with a work piece in place.

DESCRIPTION OF THE PREFERRED EMBODIMENTS

Demonstrated in FIG. 1 is a portion of a housing 5 which is penetrated by an opening 6 to accommodate a control shaft, for example, and which opening is shown fitted with a seal holder 7. Holder 7 is contoured to fit the opening and the curvature of the housing and carries a seal retainer 8 which fits within the holder 7 to maintain a flexible seal 9 in place.

FIG. 2 shows a more detailed view of a portion of the FIG. 1 arrangement. Here, it is noted that holder 7 received the retainer 8 to contain the seal 9. Seal 9 must be accurately made in order to snugly receive a through shaft or rocker arm (not shown). The gasket 9 is manufactured from foam rubber 10 surrounded by a woven shield 11 of metal fibers to prevent passage of radiation through the juncture.

The seal is annular or torroidal in shape and may be described as being in the form of a solid characterized by the revolution of a plane quadrangular figure with beveled corners about an axis in its plane but outside its borders.

Unique features of the seal include a close tolerance fit within the holder, accurate sizing of the width and thickness of the seal and an accurately molded curvature, as indicated at 12, on the leading inside edge. This smoothly rounded curvature is important to facilitate placement of the closely fitting shaft or rocker arm into opening 6 during assembly.

The seals 9 are assembled by hand using a square strand of foam rubber 10 placed within a tube 11 of woven metal fibers. The ends are joined by manipulating one end of the metal sheath over the other and interweaving, or otherwise tying down the loose ends of the metal strands. The finished product is quite irregular and in this conditon, does not make a satisfactory seal for the intended purpose.

In order to make these irregular parts usable for the desired purpose, a process has been designed which includes the use of a die arrangement such as that shown in FIG. 3. The die arrangement consists of a simple female die 13 which receives its male counter part 14 with the seal 9 confined between the contoured surfaces of the die members. When the die is closed, these surfaces act to dimension the seal 9 to conform to the requirement of close confinement within the seal holder and, particularly, the surface 16 of die 14 is contoured to produce the curved surface 12 on seal 9 having a radius of curvature of about three times as large as the radius of the other corners of the seal.

With the seal clamped in the mold, the assembly is heated to about 350° F. The mold is then cooled to about 70° F and the sized seal 9 removed from the mold. The mold may be preheated and the workpiece and mold assembly advantageously kept at about 350° F for about 3–10 seconds. The assembly may then be rapidly cooled by immersing in water, for example, before removing the workpiece from the mold.

This method produces a radiation seal which holds its shape within the close tolerances required to maintain electromagnetic compatability, thus reducing the problem generated by interference of overlapping electromagnetic fields entering the wall of a container housing electronic equipment having a shaft passing through the wall.

I claim:

1. In the process of manufacture of an electromagnetic radiation seal wherein a strip of elastomeric material is surrounded by a tube of woven metal fibers and formed into a roughly toroidal shape, the improvement comprising;

confining the roughly formed toroidal seal in a mold having the desired finished shape and size so as to form a gasket and mold assembly;

heating the gasket and mold assembly to about 350° F;

cooling the assembly to about 70° F; and removing the seal from the mold.

2. The method of forming an annular flexible radiation seal comprising:

placing a finite strand of vulcanizable elastomeric material within a section of a shielding tube of woven metal fibers;

fastening the ends of the shielding tube so that the ends of the elastomeric material are joined to form a work piece assembly;

placing the workpiece assembly in a mold which confines the workpiece assembly to a desired final shape; and heating the mold and workpiece assembly to about 350° F.

3. The method of claim 2 further including;

holding the mold and workpiece assembly at about 350° F for about 3–10 seconds; and rapidly cooling the assembly to about 70° F before removing the workpiece from the mold.

* * * * *